United States Patent [19]
Hoffman et al.

[11] Patent Number: 5,552,996
[45] Date of Patent: Sep. 3, 1996

[54] METHOD AND SYSTEM USING THE DESIGN PATTERN OF IC CHIPS IN THE PROCESSING THEREOF

[75] Inventors: Cheryl A. Hoffman, Jericho, Vt.; Mark A. Lavin, Katonah, N.Y.; William Leipold, Essex Junction, Vt.; Kathleen McGroddy, Richmond; Daniel J. Nickel, Westford, both of Vt.

[73] Assignee: International Business Machines Corporation, Armonk, N.Y.

[21] Appl. No.: 390,392

[22] Filed: Feb. 16, 1995

[51] Int. Cl.⁶ .................................................. G06F 19/00
[52] U.S. Cl. ...................... 364/468.28; 216/38; 437/225; 156/625.1
[58] Field of Search ........................... 364/468, 488–491; 216/38, 52; 437/8, 225, 974, 228; 156/625.1, 626.1, 645.1; 451/5, 9, 10

[56] References Cited

U.S. PATENT DOCUMENTS

| | | | |
|---|---|---|---|
| 4,441,207 | 4/1984 | Lougheed et al. | |
| 4,510,616 | 4/1985 | Lougheed et al. | |
| 5,029,228 | 7/1991 | Nonoyama et al. | |
| 5,046,012 | 9/1991 | Morishita et al. | 364/468 |
| 5,062,054 | 10/1991 | Kawakami et al. | 364/491 |
| 5,069,002 | 12/1991 | Sandhu et al. | 216/38 |
| 5,081,421 | 1/1992 | Miller et al. | 216/38 |
| 5,095,511 | 3/1992 | Okazaki | |
| 5,113,451 | 5/1992 | Chapman et al. | |
| 5,150,433 | 9/1992 | Daly | |
| 5,196,353 | 3/1993 | Sandhu et al. | 216/38 |
| 5,204,911 | 4/1993 | Schwartz et al. | |
| 5,222,329 | 6/1993 | Yu | |
| 5,234,868 | 8/1993 | Cote | |
| 5,240,552 | 8/1993 | Yu et al. | |
| 5,245,794 | 9/1993 | Salugsugan | |
| 5,265,378 | 11/1993 | Rostoker | |
| 5,268,999 | 12/1993 | Yokoyama | |
| 5,298,110 | 3/1994 | Schoenborn et al. | 437/8 |
| 5,307,421 | 4/1994 | Darboux et al. | |

FOREIGN PATENT DOCUMENTS

| | | |
|---|---|---|
| 2270346 | 11/1990 | Japan |
| 5128208 | 5/1993 | Japan |
| 5136356 | 5/1993 | Japan |

OTHER PUBLICATIONS

Jacobson, E. & Jambotkar, C., "Checking Design Rule Violation Concerning the Minimum Allowable Width of a Pattern in Optical Mask Design," IBM Technical Disclosure Bulletin, vol. 18, No. 6, Nov. 1975, 1892–1896.

Jacobson, E. & Jambotkar, C., "Calculation of Minimum Pattern–To–Pattern Spacing in Optical Masks," IBM Technical Disclosure Bulletin, vol. 18, No. 6, Nov. 1975, 1885–1891.

Jacobson, E. & Jambotkar, C., "Algorithm for Checking Shapes in Large–Scale Integration Layouts," IBM Technical Disclosure Bulletin, vol. 18, No. 6, Nov. 1975, 1881–1884.

Jacobson, E. & Jambotkar, C., "Computation of Minimum Spacing Between Two Nonintersecting Vectors," IBM Technical Disclosure Bulletin, vol. 18, No. 6, Nov. 1975, 1877–1880.

Jacobson, E. & Jambotkar, C., "Algorithm for Classification of Two Vectors," IBM Technical Disclosure Bulletin, vol. 18, No. 6, Nov. 1975, 1873–1876.

(List continued on next page.)

*Primary Examiner*—Roy N. Envall, Jr.
*Assistant Examiner*—Steven R. Garland
*Attorney, Agent, or Firm*—Heslin & Rothenberg P.C.

[57] ABSTRACT

The techniques of the present invention facilitate the control of an IC chip fabrication level of a fabrication process based upon the design pattern of the IC chip being fabricated. A grid having multiple sections is imposed over the design pattern of a fabrication level of the IC chip. Then, pattern density values are automatically established for the design pattern contained in each section of the grid. The IC chip fabrication level is then controlled based upon the pattern density values. For example, the established pattern density values facilitate the automatic determination of a CMP process stop parameter, or the automatic compensation for etch rate variations caused by pattern density differences across the design pattern of the IC chip.

21 Claims, 8 Drawing Sheets

OTHER PUBLICATIONS

Burke, P., "Semi-Empirical Modelling of $SiO_2$ Chemical-Mechanical Polishing Planarization," 1991 Proceedings Eighth International IEEE VLSI Multilevel Interconnection Conference, Santa Clara, Ca., Jun. 1991, IEEE Catalog No. 91 TH0359-0, 379-383.

Warnock, J., "A Two-Dimensional Process Model for Chemimechanical Polish Planarization," J. Electrochem. Soc., vol. 138, No. 8, Aug. 1991, 2398-2402.

Carr, J. & Chou, N., "End-Point Detection of Chemical/Mechanical Polishing of Circuitized Multilayer Substrates," IBM Technical Disclosure Bulletin, vol. 34, No. 4B, Sep. 1991, 406-407.

Sivaram, S., Bath, H., Lee, E., Leggett, R. & Tolles, R., "Measurement and Modelling of Pattern Sensitivity During chemical Mechanical Polishing of Interlevel Dielectrics," Advanced Metallization for ULSI Applications, Materials Research Society Conference Proceedings, Murray Hill, NJ, Oct. 1991, 511-517.

fig. 1 fig. 2 fig. 3 fig. 4 fig. 5 fig. 6 fig. 7 fig. 8

| | | | | | |
|---|---|---|---|---|---|
| L | L | M | H | M | L |
| L | M | H | H | M | L |
| L | M | H | H | M | L |
| L | M | M | M | M | L |
| L | H | H | M | M | L |
| L | L | L | L | L | L | fig. 9

| | | | | | |
|---|---|---|---|---|---|
| L | L | M | H | M | L |
| L | M | H | H | M | L |
| L | M | H | H | M | L |
| L | M | M | M | M | L |
| L | H | H | M | M | L |
| L | L | L | L | L | L | fig. 10 fig. 11 fig. 12 fig. 13

METHOD AND SYSTEM USING THE DESIGN PATTERN OF IC CHIPS IN THE PROCESSING THEREOF

TECHNICAL FIELD

The present invention relates to the fabrication of integrated circuit ("IC") chips. More specifically, the design pattern of an IC chip is used in modifying the fabrication process thereof.

BACKGROUND OF THE INVENTION

The manufacturing of IC chips is a process intensive task. Specifically, many individual process steps are performed to a wafer of semiconductor material such that multiple IC chips are simultaneously formed from the wafer. After fabrication, the individual IC chips are separated from each other, packaged, and used in electronic circuits. Improving the overall IC chip fabrication process is achieved by improving the individual processes of which it is composed. Thus, any techniques which, for example, reduce costs, reduce processing time, and/or improve quality of the individual IC chip fabrication processes are desirable.

One IC chip fabrication process is Chemical-Mechanical Polishing ("CMP"). The CMP process is used to polish the surface of a wafer during IC chip fabrication such that structures of the IC chips being fabricated are planarized. Briefly summarized, CMP comprises polishing the wafer using a polishing pad having a polishing slurry disposed thereon. The CMP process further includes several system parameters which may be used to control the polishing process, including polishing time, polishing pad composition, polishing down pressure, wafer rotation speed, and slurry composition.

As an example of an application of CMP during IC chip fabrication, an insulating layer (e.g., an oxide) may be formed over a wiring level. The insulating layer, as deposited, conformally covers the wiring level such that the upper surface of the insulating layer is non-planar. Thus, CMP may be used to planarize the upper surface of the insulating layer. Of course, it is desirable to stop the CMP process once the desired level of planarity is achieved.

The determination of when to stop a CMP process, is problematic. In particular, many parameters affect the amount of CMP processing necessary, for example, the aforementioned CMP system parameters and the density pattern of the wiring level which the polished insulating layer overlays. Thus, as various insulation layers overlaying different wiring levels of IC chips are fabricated, different amounts of CMP processing are required.

The determination of the necessary amount of CMP processing is currently performed by, for example, performing multiple CMP test trials. This is very time consuming. Specifically, the test trials necessary to determine the CMP processing time for an insulating layer overlaying a single wiring level on an IC chip may take, for example, over a half of a day. This problem is compounded by the presence of multiple levels of wiring on the IC chip such that a CMP processing time must be determined for each of the levels of wiring. Thus, as an example, conventional methods may require two and one-half days of testing to determine the CMP processing times for a new IC chip with 5 levels of wiring. This detrimentally increases the amount of time needed to bring a new IC chip to production.

Another IC chip fabrication process comprises photolithographic creation of structures on the IC chips being manufactured from the wafer. For example, silicon and/or metal structures may be created using photolithography. In specific regard to the photolithography process, although photolithographic masks may be error free in design, certain distortions nonetheless arise during actual photolithographic processing. These distortions negatively impact resultant IC chip quality.

One type of distortion that arises during photolithographic processing is caused by variations in etch rate. Specifically, IC chip areas with a high pattern density are known to etch faster than IC chip areas with a low pattern density (note: the "pattern" refers to the defining photolithographic pattern for an etched structure). Thus, for a given etch time, a disproportionately greater amount of material will be etched from high density areas than low density areas. Problems therefore arise in etched areas that require precise dimensional tolerance, such as, for example, precisely controlled transistor channel lengths. As of this date, no automatic way to correct this problem is known.

The present invention is directed towards solving all of the above noted problems.

DISCLOSURE OF THE INVENTION

Briefly described, in a first aspect, the present invention includes a method, using a programmed computer, for controlling a fabrication level of a fabrication process to produce an integrated circuit ("IC") chip. The IC chip has a fabrication level which proceeds according to a design pattern.

The method includes imposing a grid over the design pattern. Specifically, the grid has a plurality of sections, of which each has a portion of the design pattern contained therein. A pattern density value is automatically established for each of the sections based upon the portion of the design pattern contained therein. Further, the established pattern density values are used to control the fabrication level.

As an enhancement, the IC chip fabrication process may comprise chemical mechanical polishing ("CMP"). The method then includes controlling the IC chip fabrication process by automatically establishing a CMP process stop parameter as a function of the established pattern density values. Further, the CMP process stop parameter may comprise a CMP processing time or a CMP target removal value.

As a further enhancement, the IC chip fabrication process may comprise photolithographic etching. The method then includes controlling the IC chip fabrication process by automatically adjusting the design pattern of the fabrication level of the IC chip as a function of the established pattern density values. The adjusting is performed such that etching errors due to pattern density based etch rate variations are automatically compensated for.

The present invention has numerous advantages and feature associated therewith. To summarize, all of the techniques described herein operate at the design level. As a first example, the determination of when to stop a CMP process is performed in anticipation of actual fabrication using design pattern data for the IC chip. Also, automatic design pattern correction to compensate for etch rate variations is facilitated at the design stage, and not by fabrication test trials. Accordingly, the corresponding time and expense associated therewith are eliminated such that the IC chip fabrication process as a whole is improved.

BRIEF DESCRIPTION OF THE DRAWINGS

The subject matter which is regarded as the present invention is particularly pointed out and distinctly claimed in the concluding portion of the specification. The invention, however, both as to organization and method of practice, together with further objects and advantages thereof, may best be understood by reference to the following detailed description taken in conjunction with the accompanying drawings in which:

BEST MODE FOR CARRYING OUT THE INVENTION

The techniques of the present invention improve IC chip fabrication by facilitating the adjustment of an IC chip fabrication process based upon a defining design pattern for each fabrication level of the subject IC chip. In accordance therewith, the design data for the IC chip is analyzed using a programmed computer. Specifically, the design pattern for a given fabrication level is analyzed, and the pattern densities of the design pattern within various areas of the IC chip fabrication level are determined. A pattern density comprises, for example, the amount of metal or silicon defined by the design pattern within a given area of the fabrication level. Thus, for example, an area with a large amount of metal would have a higher pattern density than an area with a lesser amount of metal.

The determination of the pattern densities of the different areas of the fabrication level are used in controlling the IC chip fabrication process. Specifically, one embodiment of the present invention facilitates a determination of when to stop CMP processing of, for example, an insulating layer overlaying the wiring of an IC chip fabrication level. In another embodiment, the design pattern for a fabrication level is automatically adjusted to compensate for etch rate variations that result from differences in pattern density across the fabrication level. Thus, the techniques of the present invention facilitate adjustment of, and corresponding improvements to, the IC chip fabrication process.

Figure 1:
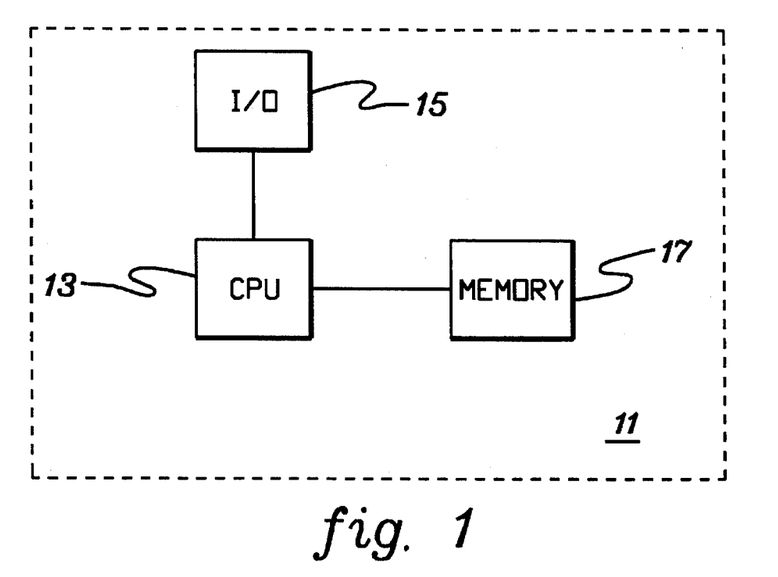
FIG. 1 is a block diagram of a computer system used in the implementation of the techniques of an embodiment of the present invention.

The techniques of the present invention may be implemented using conventional computer technology. For example, a typical computer system is shown in FIG. 1. A computer system 11 includes a central processing unit ("CPU") 13, an input/output ("I/O") device 15 and memory 17 (e.g., random access memory or disc memory). The present invention may be performed using computer system 11 such that when programmed, computer system 11 constitutes a system in accordance with the present invention. For example, a typical computer system could comprise an International Business Machines RISC System/6000.

As noted, one IC chip fabrication process adjustment in accordance with the techniques of the present invention includes an accurate determination of when to stop CMP processing, i.e., a CMP process stop parameter. This is used during, for example, planarization of an insulating layer which overlays a wiring level. Specifically, the design pattern for the wiring level beneath the insulating layer to be planarized is analyzed. Based thereupon, the CMP process stop parameter is determined.

It has been discovered that various characteristics of the wiring level's design pattern affect the rate at which CMP processing of an insulating layer disposed thereabove occurs. Specifically, the following heuristic rules relating thereto have been observed:

areas of insulator disposed above dense wiring require longer polishing times;

areas of insulator disposed above small empty spaces which are surrounded by dense wiring require longer polishing times, wherein the size of the small empty spaces is determined by the surrounding metal step height, the insulating layer thickness and the physics of the polishing operation; and areas of insulator disposed above small, isolated wiring features tend to polish quickly.

Thus, to restate, the CMP process is significantly affected by the density of the wiring level underneath the polished insulating layer. Other factors which affect the CMP processing rate include CMP system parameters such as polishing pad pressure, polishing pad composition, polishing down pressure, wafer rotation speed, and slurry composition. Preferably, in practice these CMP system factors are desirably kept constant such that the number of variables which affect the CMP processing rate is reduced.

A first CMP process stop parameter may comprise a CMP processing time. This is a time period during which the CMP process is performed such that the desired level of planarity is achieved. Another CMP process stop parameter may comprise a target removal value. This is a predetermined amount of insulation to be removed from a wafer monitor site which, when removed, indicates that CMP processing has been completed. In either case, accurate CMP processing is facilitated based upon the design pattern of a fabrication level rather than expensive and time consuming experimentation. Thus, a new IC chip can be put into production more quickly and with less expense.

Figure 2:
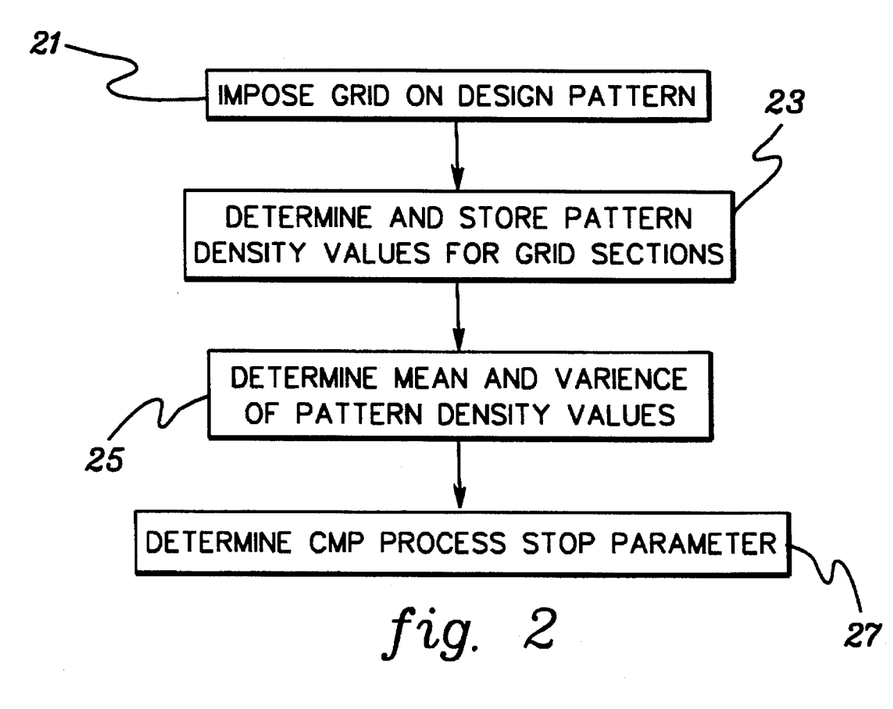
FIG. 2 is a flow diagram of a method for determining a polish stop parameter in accordance with one embodiment of the present invention.
Figure 3:
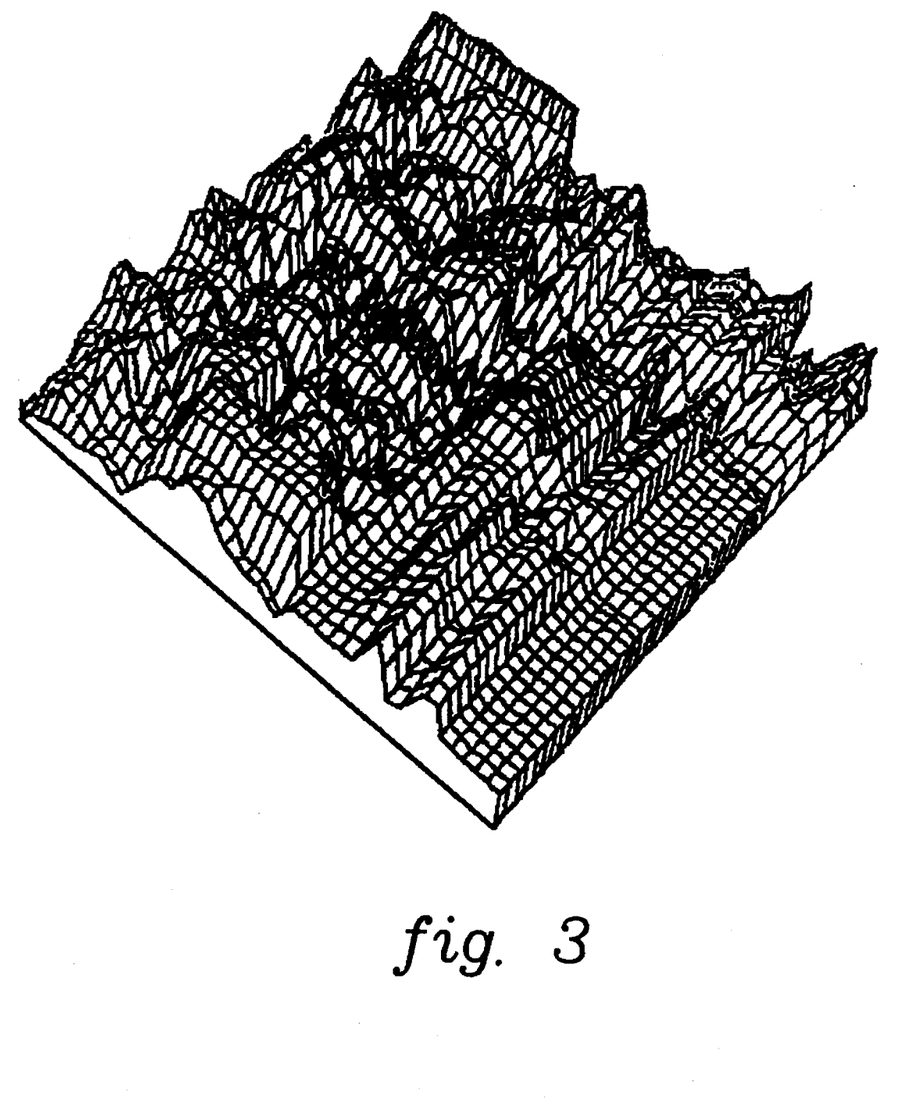
FIG. 3 is a perspective view of a wiring density map of an IC chip in conformance with an embodiment of the present invention.

Regardless of whether a CMP processing time or a CMP target removal value is used as the CMP process stop parameter, the techniques of the present invention begin with imposing a grid on the design pattern of the fabrication level (e.g., a wiring level) (21 - FIG. 2). Specifically, as is well known, each wiring level within an IC chip is defined by design data. This data is typically used to generate the patterned masks used during photolithographic processing of the wafer from which the IC chips are fabricated. According to the techniques of the present invention, automated computer techniques are used to define a grid over the design pattern of the wiring level, and within each section of the grid, a pattern density value is determined based upon the design pattern of the wiring level therewith (23 - FIG. 2). For example, section 61 of the sample grid of FIG. 8 contains a wiring pattern density of 10% metal which corresponds to a pattern density value of 0.1. The pattern density values for the other sections of the grid are similarly determined. After being determined, these pattern density values are stored in the memory of the computer. By way of further example, a three-dimensional pattern density map of an actual IC chip is shown in FIG. 3. The individual programming steps needed to determine and store the pattern density values for a fabrication level of an IC chip will be apparent to one of ordinary skill in the art.

Figure 4:
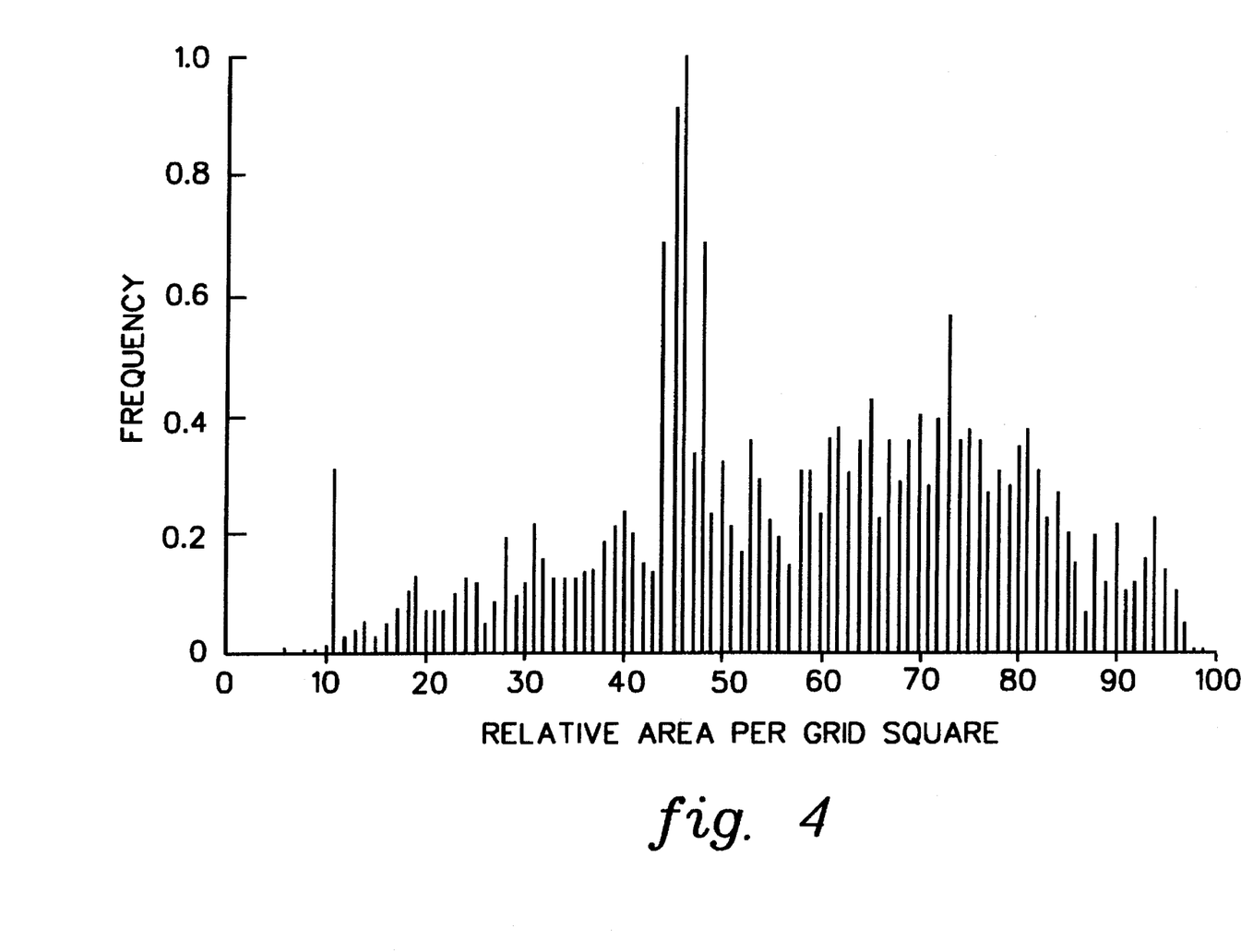
FIG. 4 is a graph of the wiring density distribution of an IC chip pursuant to one embodiment of the present invention.

To continue, statistical analysis is performed on the density values for the entire grid. As one example, a wiring density distribution is shown in FIG. 4 which corresponds to an IC chip fabrication level whose pattern density map is shown in FIG. 3. As part of this analysis, a mean density of 0.589 and a variance of 0.04185 are determined. The techniques of the present invention make subsequent use of these statistical values (25 - FIG. 2).

Figure 5:
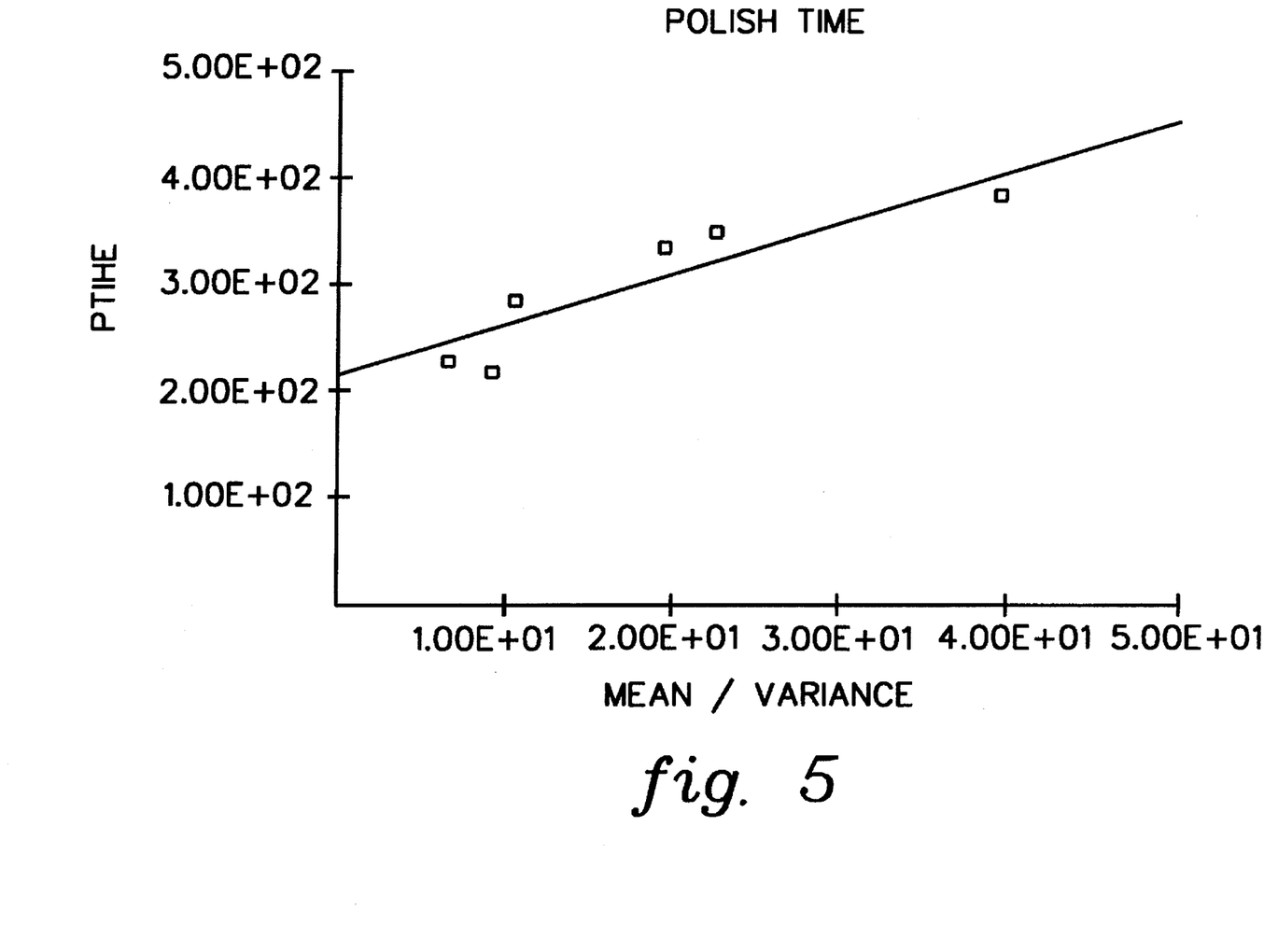
FIG. 5 is a graph of CMP polish time versus wiring density for an IC chip in conformance with one embodiment of the present invention.

In the embodiment of the present invention in which CMP processing time is the CMP process stop parameter, a relationship between the above determined mean and variance, and the CMP processing time is determined (27). Specifically, this relationship is:

CMP Processing Time=a*(mean/variance)+b, wherein the values of a and b are constants. To determine these constants, numerous CMP test runs are performed for multiple fabrication levels on different IC chips (or pre-existing data could be used if available). As each CMP test run is successfully performed, the polish time is graphed versus the mean/variance corresponding to the particular fabrication level being polished (FIG. 5). The method of least squares is then used to determine the values of the constants, a and b, such that the use of the above-described CMP processing time relationship is facilitated. Once these constants are determined, they need not be recalculated unless the CMP system parameters, or IC chip fabrication technology substantially change. The individual steps of the method of least squares will be apparent to one of ordinary skill in the art.

Thus, the techniques of the present invention facilitate the accurate determination of the CMP processing time for a fabrication level of an IC chip based upon its design pattern. As an application example, when a new IC chip wiring level is designed, the techniques of the present invention facilitate the automated and rapid determination of the required CMP processing time for an insulating layer overlaying it. This alleviates the time and expense associated with conventional trial and error methods for determining CMP processing time for a new fabrication level of an IC chip. Thus, the present invention facilitates a marked improvement in overall IC chip fabrication processes which involve CMP.

It should be noted that although most system parameters can be maintained constant during CMP, certain system parameters will change. These include the composition of both the polishing pad and the polishing slurry. Specifically, as the polishing pad and polishing slurry are repeatedly used, they age such that the CMP process uniformly slows. Thus, as aging progresses, the CMP processing time determined by the techniques of the present invention must be increased. This is a slow and linear increase, and is easily determined by maintaining a log of the pad and slurry age (i.e. times used) and gradually increasing the CMP processing time in accordance therewith. Determining the amount of increase necessary due to the above-described aging is currently performed with respect to conventional CMP processing and will be apparent to one of ordinary skill in the art.

In accordance with the techniques of present invention, the determination of CMP process stop parameters other than CMP processing time are possible. For example, as discussed hereinabove, the CMP process stop parameter may comprise a target removal value (a desirable amount of insulation removed from a test site on a wafer). In such an embodiment, the relationship between the above determined mean and variance of the density values and the target removal value may be expressed as:

target removal=a*exp(b*(1-mean)/variance)

Figure 6:
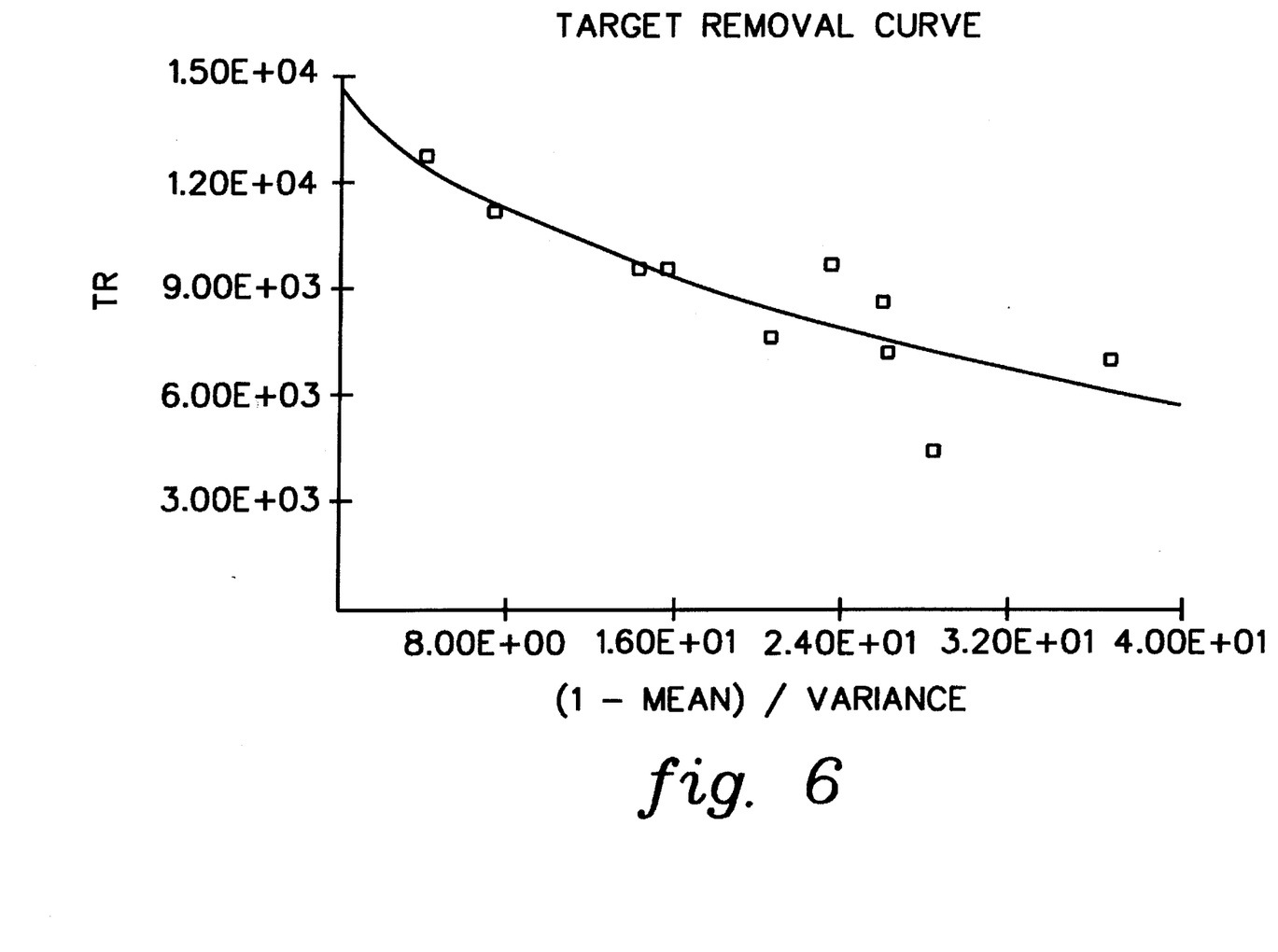
FIG. 6 is a graph of target removal values versus wiring density for an IC chip according to an embodiment of the present invention.

The values of a and b are again constants, and are empirically determined in a manner similar to the embodiment in which CMP processing time is determined. Specifically, numerous test runs of CMP are performed for different fabrication (e.g., wiring) levels on different IC chips (or pre-existing data could be used if available). As each CMP process is successfully performed, the target removal value ("TR") is graphed versus (1-mean)/variance for the particular wiring level being processed (FIG. 6). The method of least squares is again used in combination with the accumulated test data to determine the values of the constants, a and b, in the above referenced equation. Thus, the techniques of the present invention facilitate accurate CMP processing by determining a target removal value which indicates when CMP processing is to stop.

In specific regard to detecting when the target removal value has been achieved, a test site is established on each wafer for monitoring the amount of insulation removed therefrom. As CMP progresses, the process is periodically stopped, and the amount of insulation removed from the test site is measured. When the target removal value has been reached, the CMP process is completed.

Although this technique requires the stopping of the CMP process, the aging of the polishing pad and polishing slurry is automatically accounted for. To explain, as the polishing pad and polishing slurry age, the CMP process will uniformly slow down across the entire IC chip, regardless of pattern density variations. Thus, although the subject aging will cause the CMP processing time to increase, when the target removal value is achieved, the correct amount of CMP will have been performed. It is expected that future advances in wafer monitoring will facilitate "on-line" measurement of insulation removed from the test site such that the CMP process need not be periodically stopped for monitoring purposes.

In an alternate embodiment of the present invention, the determined density values of the IC chip fabrication level facilitate design pattern correction to account for differences in etch rate variations based upon pattern density. Specifically, as discussed hereinabove, IC chip structures that undergo photolithographically controlled etching are subject to different etch rates based upon their respective densities. As the density of a structure becomes greater, the etch rate associated with that structure becomes faster. For example, when a fabrication level of an IC chip being formed on a wafer is subject to etching, areas on the chip that have high pattern densities will etch more quickly than areas with low pattern densities. Etch errors will therefore occur because during a predetermined etch time, a disproportionately greater amount of material will be etched from the higher pattern density areas, in comparison to the lower pattern density areas.

The techniques of the present invention solve this problem by automatically introducing design pattern correction in areas of the design pattern based upon that area's pattern density. Specifically, the aforementioned pattern density value grid techniques are used to determine pattern density values for each section of the subject IC chip fabrication level. Thereafter, the design pattern of the subject fabrication level is adjusted to account for the differing etch rates. In particular, the widths of the pattern lines which compose the design pattern are increased in dense pattern areas such that, when faster etching thereupon occurs, the final etched fabrication level will have correctly sized pattern lines. Thus, the techniques described herein automatically provide design pattern correction which accounts for pattern density related etch rate variations.

A method for performing the density based design pattern correction techniques of the present invention is described is detail below with regard to the flow diagram of FIG. 7. The method begins with the imposing of a grid on the design pattern of the subject fabrication level of the IC chip (51). Thereafter, density values for each section of the grid are determined and stored in the memory of the computer system (53). This is performed as described hereinabove with respect to the CMP process stop parameter embodiments of the present invention. As an example, FIG. 8 shows a sample grid having density values in each section. In particular, section 61 has a density value of 0.1, section 63 has a density value of 0.9 and section 65 has a density value of 0.4. A grid of density values corresponding to the fabrication level of the subject IC chip is thus determined.

Figure 7:
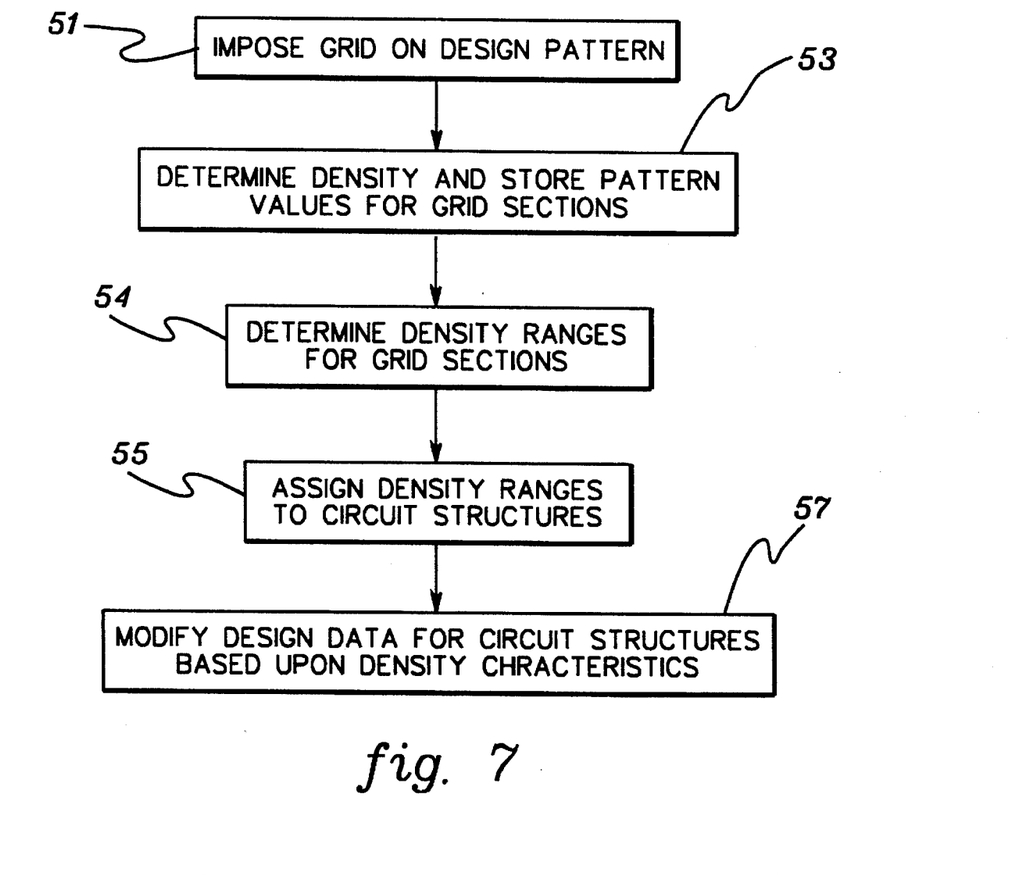
FIG. 7 is a flow diagram of a method for performing shape adjustments to the design data of an IC chip according to one embodiment of the present invention.
Figure 8:
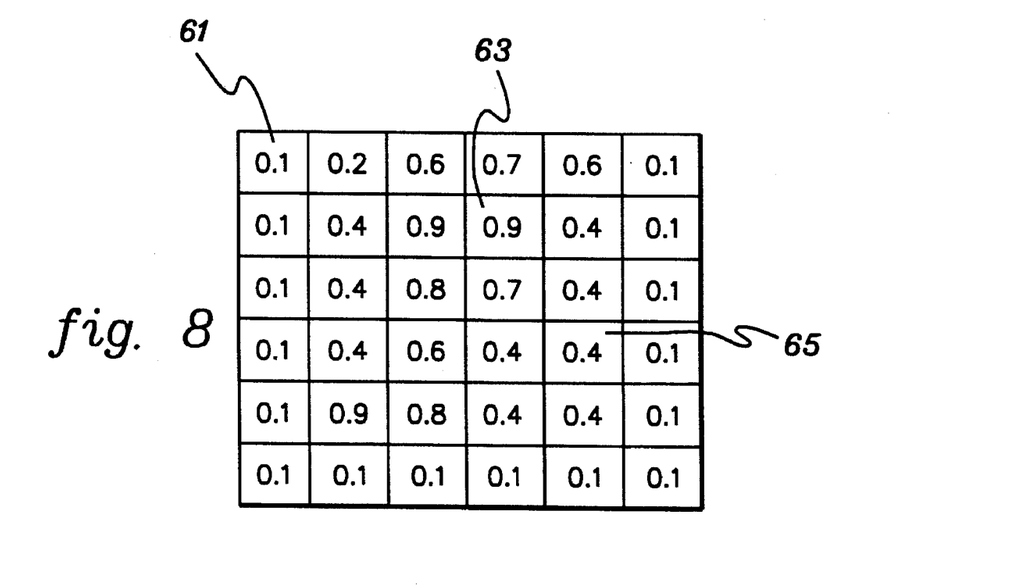
FIG. 8 is a grid of density values for an IC chip in conformance with an embodiment of the present invention.

A next process step includes the determination of a "density range" for each grid section (54 - FIG. 7). The density range is determined by associating ranges of density values with corresponding "density ranges." For example, in the current embodiment, three density ranges are established as follows:

| Density Values | Density Range |
| --- | --- |
| 0.0–0.3 | Low (L) |
| 0.4–0.6 | Medium (M) |
| 0.7–1.0 | High (H) |

Figure 9:
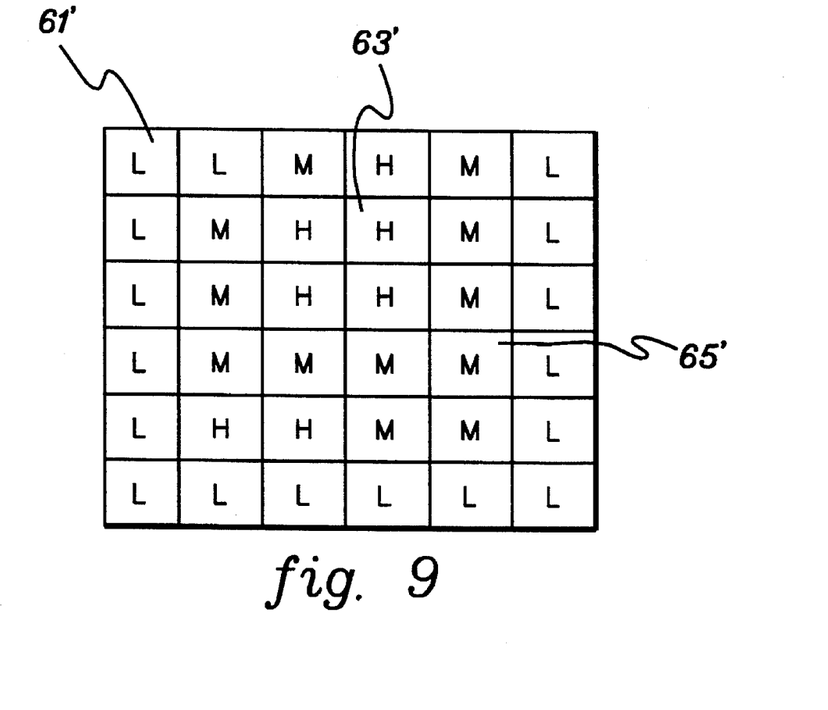
FIG. 9 is the grid of FIG. 8 having a density range for each grid section pursuant to one embodiment of the present invention.

FIG. 9 shows the grid of FIG. 8 subsequent to the determination of a density range for each grid section based upon its density value. As examples, section 6' of FIG. 9 is characterized as low density (L) based upon its corresponding density values of 0.1 in section 61 of FIG. 8, section 63' of FIG. 9 is characterized as high density (H) based upon its corresponding density values of 0.9 in section 63 of FIG. 8 and section 65' of FIG. 9 is characterized as medium density (M) based upon its corresponding density values of 0.4 in section 65 of FIG. 8. Thus, a grid of density ranges is determined for the subject IC chip fabrication level.

Figure 10:
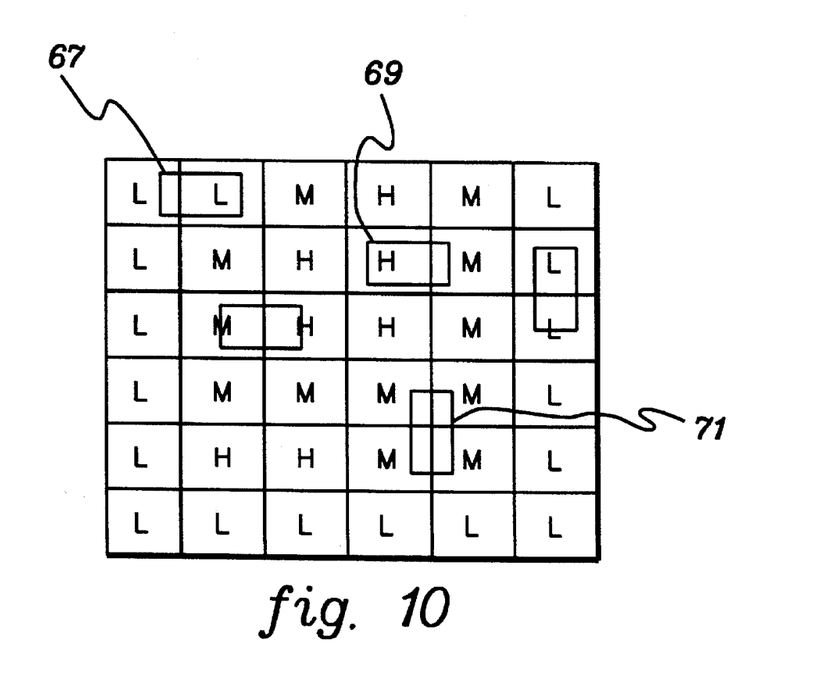
FIG. 10 is the grid of FIG. 9 with gate areas shown thereon according to an embodiment of the present invention.

In further accordance with the techniques of the present invention, the grid of density ranges is used to assign density ranges to individual circuit structures which are part of the subject IC chip fabrication level (55 - FIG. 7). As one example, circuit structures comprising individual gates may be assigned density ranges. In FIG. 10, the areas occupied by individual gates within the subject fabrication level are shown in combination with the density range grid. The density range of each gate is assigned as the density range of the maximum density grid area contacted by the gate. As examples, gate 67 is assigned a density range of low (L), gate 69 is assigned a density range of high (H) and gate 71 is assigned a density range of medium (M). The computer programming techniques required to perform the individual steps of the above described assignments will be apparent to one of ordinary skill in the art.

Figure 11:
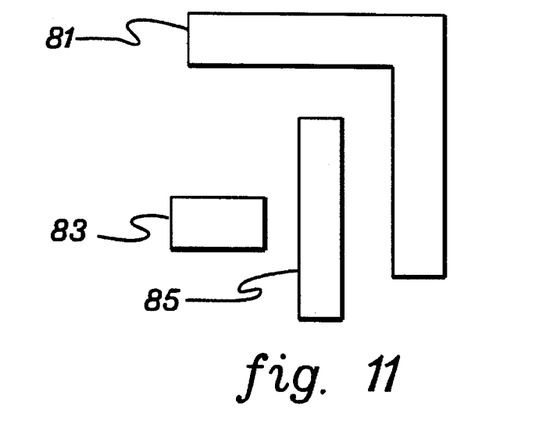
FIGS. 11–13 are schematic diagrams of various thickness IC chip wiring in conformance with one embodiment of the present invention.
Figure 12:
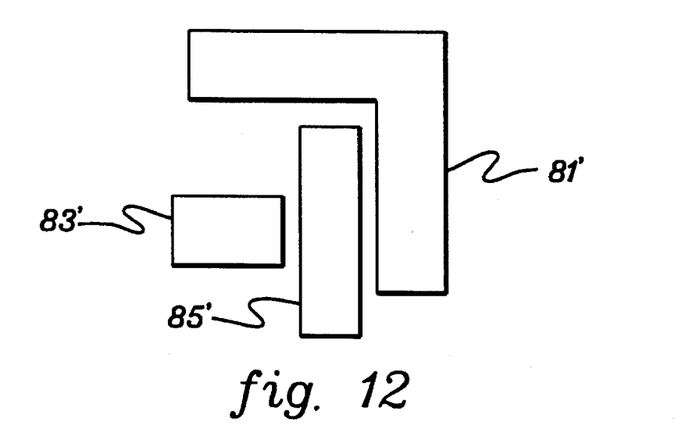
Figure 13:
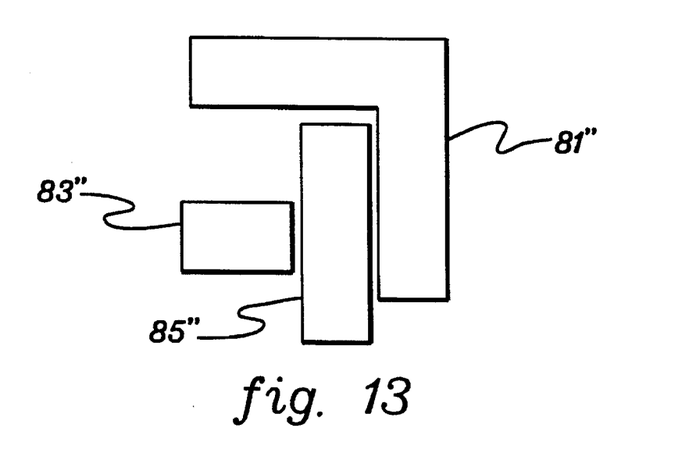

The assignment of a density range to each gate may then be used in the adjustment of the patterned lines of the design pattern which compose the gate (FIGS. 11–13). For example, adjustment to the patterned lines of the design pattern for the individual gates of the subject fabrication level is performed as follows:

| Density Range | Line Width Adjustment |
| --- | --- |
| Low | 0% |
| Medium | +5% |
| High | +10% |

As examples of design pattern adjustments, an original etch (design) pattern is shown in FIG. 11, while in FIG. 12, an upwardly adjusted pattern is shown, enlarged to accommodate a faster etch process based upon a higher density. The pattern is shown even further enlarged in FIG. 13. The width enlargement of the design patterns associated with individual gates is performed similarly. Specifically, the lines of the design pattern of each gate are enlarged based upon that gate's density range. Thus, during fabrication, the enlarged areas account for the faster etching thereof due to higher pattern density.

The amount of adjustment necessary for different IC chip technologies may be determined empirically by steps which will be apparent to one of ordinary skill in the art. As one technology example, in a 0.5 micron fabrication process, no increase to line width is performed for low density gates, while a 0.025 micron line thickness increase is performed for medium density gates and a 0.05 micron line thickness increase is performed for high density gates. Thus, upon etching, adequate line width adjustment is provided such that pattern density based etch rate variations are accounted for.

In general, the computer programming techniques required to implement the individual steps of the present invention will be apparent to one of ordinary skill in the art. One tool that facilitates the implementation of these techniques is, for example, the NIAGARA Extensible Shapes Processor which executes on an International Business Machines RISC System/6000. NIAGARA is a product of International Business Machines Corporation of Armonk, N.Y. Another tool is VERICHECK by Integrated Silicon Systems of Research Triangle Park, N.C. The data files that define the subject IC chip fabrication level design pattern are analyzed using Niagara to produce statistical results. These statistical results may be used to determine a CMP process stop parameter. Also, Niagara facilitates the modification of the design pattern defining the fabrication level such that when a photolithographic mask (or electron-beam lithography control file) is produced, pattern density based etch rate variations will be compensated for.

The techniques of the present invention have numerous advantages and features associated therewith. All of the techniques described herein operate at the design level. As a first example, the determination of when to stop a CMP process is performed in anticipation of actual fabrication using design pattern data for the IC chip. Also, automatic design pattern correction to compensate for etch rate variations is facilitated at the design stage, rather than by multiple fabrication test trials. Accordingly, the corresponding time and expense associated therewith are eliminated such that the IC chip fabrication process as a whole is improved.

While the invention has been described in detail herein, in accordance with certain preferred embodiments thereof, many modifications and changes therein may be affected by those skilled in the art. Accordingly, it is intended by the appended claims to cover all such modifications and changes as fall within the true spirit and scope of the invention.

What is claimed is:

1. A method, using a programmed computer, for controlling a fabrication level of a fabrication process to produce an integrated circuit ("IC") chip, said fabrication level proceeding according to a design pattern, said method comprising the steps of:

(a) imposing a grid over said design pattern, said grid having a plurality of sections, each section of said plurality of sections having a portion of said design pattern contained therein;

(b) automatically establishing a pattern density value for each section of said plurality of sections based upon said portion of said design pattern contained therein; and (c) controlling said fabrication level based upon said pattern density values established in said step (b) to improve said fabrication process.

2. The method of claim 1, wherein said fabrication level comprises chemical mechanical polishing ("CMP"), and wherein said controlling step (c) further comprises automatically establishing a CMP process stop parameter as a function of said pattern density values established is said step (b).

3. The method of claim 2, wherein said method further includes automatically performing a statistical analysis of said pattern density values established in said step (b), said controlling step (c) further comprising automatically establishing said CMP process stop parameter as a function of said statistical analysis.

4. The method of claim 3, wherein said statistical analysis comprises determining a mean and a variance for said pattern density values, said controlling step (c) comprising automatically establishing said CMP process stop parameter as a function of said mean and said variance.

5. The method of claim 4, wherein said CMP process stop parameter comprises CMP process time such that said controlling step (c) comprises automatically establishing said CMP process time as a function of said mean and said variance.

6. The method of claim 5, wherein said function of said controlling step (c) comprises a*(mean/variance)+b, wherein a and b are constants.

7. The method of claim 4, wherein said CMP process stop parameter comprises a CMP target removal value such that said controlling step (c) comprises automatically establishing said CMP target removal value as a function of said mean and said variance, wherein said target removal value comprises an amount of insulation to be removed from a wafer test site during CMP.

8. The method of claim 7, wherein said function of said controlling step (c) comprises a*exp(b,(1-mean)/variance)), wherein a and b are constants.

9. The method of claim 1, wherein said IC chip fabrication level comprises photolithographically controlled etching, and wherein said method further comprises, prior to said controlling step (c), automatically adjusting said design pattern as a function of said pattern density values established in said step (b) such that etching errors due to pattern density based etch rate variations are automatically reduced.

10. The method of claim 9, wherein said method further includes automatically establishing, for each section of said plurality of sections of the grid, a first density range as a function of the density value for that section of the grid, said automatically adjusting of said design pattern further comprising automatically adjusting said design pattern as a function of said first density ranges.

11. The method of claim 10, wherein said design pattern defines a plurality of circuit structures of said IC chip, said method further including assigning a second density range to each circuit structure as a function of said first density ranges of said plurality of sections of said grid, said second density ranges of said circuit structures facilitating said step of automatically adjusting said design pattern to reduce said pattern density based etch rate variations.

12. The method of claim 11, wherein for each circuit structure, said assigning of said second density range to the circuit structure comprises assigning a maximum density range of said first density ranges of sections of said grid contacted by the circuit structure.

13. The method of claim 12, wherein each circuit structure of said plurality of circuit structures is defined by a corresponding portion of the design pattern, and wherein said automatically adjusting of said design pattern includes, for each circuit structure of said plurality of circuit structures, adjusting the corresponding portion of the design pattern if the second density range of the circuit structure is within a first plurality of second density ranges.

14. The method of claim 13, wherein the corresponding portion of the design pattern for each circuit structure of said plurality of circuit structures includes at least one line, and wherein for each of said plurality of circuit structures, said adjusting of said design pattern includes adjusting a width of said at least one line as a function of the second density range of the circuit structure if the second density range is within said first plurality of second density ranges.

15. The method of claim 14, wherein said adjusting of said design pattern includes for each circuit structure adjusting the design pattern for the circuit structure such that the width of the at least one line is increased a first amount if the second density range of the circuit structure comprises a first predefined density range.

16. The method of claim 15, wherein said adjusting of said design pattern includes for each circuit structure adjusting the design pattern for the circuit structure such that the width of the at least one line is increased a second amount if the second density range of the circuit structure comprises a second predefined density range.

17. The method of claim 14, wherein, for each circuit structure, said method includes preserving the design pattern of the circuit structure if the second density range of the circuit structure comprises a third predefined density range.

18. The method of claim 1, further in combination with completing said fabrication process, subsequent to said controlling step (c).

19. A system for controlling a fabrication level of a fabrication process to produce an integrated circuit ("IC") chip, said fabrication level proceeding according to a design pattern, said system comprising:

means for imposing a grid over said design pattern, said grid having a plurality of sections, each section of said plurality of sections having a portion of said design pattern contained therein;

means for automatically establishing a pattern density value for each section of said plurality of sections based upon said portion of said design pattern contained therein; and means for controlling said fabrication level based upon said pattern density values to improve said fabrication process.

20. The system of claim 19, wherein said fabrication process comprises chemical mechanical polishing ("CMP"), and wherein said means for controlling comprises means for automatically establishing a CMP process stop parameter as a function of said pattern density values.

21. The system of claim 19, wherein said fabrication process comprises photolithographically controlled etching, and wherein said means for controlling comprises means for automatically adjusting said design pattern as a function of said pattern density values prior to said photolithographic etching such that etching errors due to pattern density based etch rate variations are automatically reduced during said photolithographically controlled etching.

* * * * *

UNITED STATES PATENT AND TRADEMARK OFFICE
CERTIFICATE OF CORRECTION

PATENT NO.: 5,552,996

DATED: Sep. 3, 1996

INVENTOR(S): Hoffman et al.

It is certified that error appears in the above-identified patent and that said Letters Patent is hereby corrected as shown below:

In the Claims:

Column 9, line 62, delete "a*exp(b,(1-mean)/variance))" substituate therefor --.a*exp(b*(1-mean)/variance))--.

Signed and Sealed this

Twenty-fifth Day of February, 1997

Attest:

BRUCE LEHMAN

*Attesting Officer*      *Commissioner of Patents and Trademarks*